(12) United States Patent
Lofmark

(10) Patent No.: US 7,447,305 B2
(45) Date of Patent: Nov. 4, 2008

(54) METHOD AND ARRANGEMENT FOR FILTERING OF SIGNALS

(75) Inventor: Bengt Gustav Lofmark, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1479 days.

(21) Appl. No.: 09/768,217

(22) Filed: Jan. 24, 2001

(65) Prior Publication Data

US 2001/0019608 A1 Sep. 6, 2001

Related U.S. Application Data

(60) Provisional application No. 60/179,484, filed on Feb. 1, 2000.

(30) Foreign Application Priority Data

Jan. 27, 2000 (SE) .................................... 0000264

(51) Int. Cl.
*H04M 1/00* (2006.01)
(52) U.S. Cl. ..................................... 379/378
(58) Field of Classification Search ................. 379/398, 379/349.01
See application file for complete search history.

(56) References Cited

U.S. PATENT DOCUMENTS

| | | | |
|---|---|---|---|
| 4,443,662 A | 4/1984 | Nakhia | |
| 4,456,985 A | 6/1984 | Carsten et al. | |
| 4,764,922 A | 8/1988 | Dieter et al. | |
| 4,982,426 A * | 1/1991 | Jakab | .......................... 379/402 |
| 5,528,630 A | 6/1996 | Ashley et al. | |
| 5,623,543 A | 4/1997 | Cook | |
| 5,627,501 A | 5/1997 | Biran et al. | |
| 5,757,803 A | 5/1998 | Russell et al. | |
| 5,770,982 A * | 6/1998 | Moore | .......................... 333/32 |
| 5,848,150 A | 12/1998 | Bingel | |
| 6,137,880 A * | 10/2000 | Bella | ...................... 379/399.01 |
| 6,459,790 B1 * | 10/2002 | Eckert et al. | ........... 379/399.01 |
| 6,477,249 B1 * | 11/2002 | Williamson et al. | ..... 379/399.01 |
| 6,804,349 B1 * | 10/2004 | Prat et al. | .................... 379/402 |
| 6,813,343 B1 * | 11/2004 | Vitenberg | ................ 379/93.05 |

FOREIGN PATENT DOCUMENTS

EP 0 923 221 A1 * 6/1999

(Continued)

OTHER PUBLICATIONS

American radio relay league, The Radio Amateur's Handbook, 1973, American Radio Relay League, fifth edition, pp. 41-50.*

(Continued)

*Primary Examiner*—Ramnandan Singh
(74) *Attorney, Agent, or Firm*—Nixon & Vanderhye, P.C.

(57) ABSTRACT

A filter (45) is passive and has a complex impedance which gives good impedance matching to the complex impedance of a transmission line. Because the filter is passive, it does not need to be powered and can thus be placed in locations that lack a power supply. The filter can also function in the event of a power failure. Because the filter has an impedance which can be well matched to the complex impedance of a transmission line, problems relating to echo and side tones can be minimized.

33 Claims, 7 Drawing Sheets

FOREIGN PATENT DOCUMENTS

| | | |
|---|---|---|
| EP | 0 942 578 A2 | 9/1999 |
| WO | 99/65217 | 12/1999 |
| WO | 00/28660 A1 | 5/2000 |

OTHER PUBLICATIONS

The Radio Amateurs Handbook;1973 , Pub: American Radio Relay League; pp. 41-50.*

Cook et al, "ADSL and VADSL Splitter Design and Telephony Performance", IEEE Journal on Selected Areas in Communications, vol. 13, No. 9, Dec. 1995, pp. 1634-1642.

ITU-T Draft G.992.1, 1999, pp. 182-204.

Pulse, New Product Proposal, B2130, REF B2130.A Proposal, Sep. 2, 1999.

EP Office Action mailed Nov. 21, 2006 in corresponding EP application No. 01902884.4.

* cited by examiner

METHOD AND ARRANGEMENT FOR FILTERING OF SIGNALS

This application claims the benefit of U.S. Provisional Application No. 60/179,484, filed 1 Feb. 2000, the entire content of which is hereby incorporated by reference in this application.

FIELD OF INVENTION

The present invention relates to signal filters in general and to filters for filtering of signals in a telecommunications system in particular.

BACKGROUND ART

It has become progressively more usual in present-day telecommunication systems to transmit different types of information on a common transmission line in different frequency bands. One example of such a system is ADSL (Asymmetric Digital Subscriber Line) which enables standard telephony in speech form (POTS=Plain Old Telephone Service) and broadband services, such as video or data, to be transmitted in parallel over a conventional copper pair cable network. This technique allows the existing copper pair cable network to be utilised more effectively, which is of the greatest interest in view that it is very costly and time consuming to replace the copper cable with high capacity optical fibres, for instance. There is also a high-speed variant of ADSL called VADSL or VDSL (Very High Speed ADSL).

Because POTS traffic only uses the frequency band up to 4 kHz, a large part of the available frequency band in a transmission line often goes unused. In ADSL systems, a higher frequency range of, e.g., 25-1000 kHz is used for broadband services of about 1.5-6 Mbit/s. The information transmitted in the higher frequency range is called ADSL traffic or ADSL signals. When the telecommunication traffic arrives at receiver of a subscriber or of an exchange of an operator, the POTS traffic and ADSL traffic are separated from one another, often with the aid of so-called splitter filters. The splitter filter includes a low-pass filter between the transmission line and the subscriber telephone/the line interface board of the telephone exchange and a high-pass filter between the transmission line and an ADSL modem belonging to the subscriber or installed in the telecommunications exchange.

In order to obtain optimal transmission properties and to avoid echo, it is desirable that the nominal impedance of the splitter filter be similar to the transmission line impedance or to the impedance resulting from a combination of the transmission line impedance and a terminating impedance in the remote end of the transmission line. The impedance of a transmission line is complex, whereas the terminating impedance may be either complex or resistive. The expression "transmission line impedance" used hereinafter includes both cases where precisely the impedance of the transmission line is meant and when the combination of the transmission tine impedance and the terminating impedance is meant.

It is particularly important to avoid echo in the speech band and consequently of particular importance that the impedance of the low-pass filter is matched satisfactorily to the transmission line impedance. Because the transmission line impedance is complex, it is desirable that the impedance of the low-pass filter is also complex. It is also desirable that the filter is passive so as to avoid power supply problems and to ensure that the filter will continue to function in the event of a power failure. However, no method of providing a passive low-pass filter with an impedance that is complex in a manner, which will allow the filter impedance to be matched satisfactorily to the complex impedance of a transmission line, has been known hitherto.

One solution to this problem involves embedding a passive low-pass filter that has a resistive impedance between General Impedance Converters (GIC). The GICs transform the resistive impedance of the filter so that the arrangement of GICs and filter has a complex impedance, seen from the transmission line. The GICs used in this connection include transformers and amplifiers and are thus active. Thus, the whole of the filter arrangement including low-pass filters and GICs is active and need for a power supply is still unavoidable with this method.

The technique of embedding a filter having a resistive impedance between two GICs in order to obtain a complex nominal impedance is known, e.g., from U.S. Pat. No. 5,623,543 and the article "ADSL and VADSL Splitter Design and Telephony Performance" by John Cook and Phil Sheppard, published in IEEE Journal on Selected Areas in Communications, Vol. 13, No. 9, December 1995. The importance of impedance matching is also discussed in the aforesaid patent specification and in said article.

Passive filters for systems in which different types of information are transmitted over one and the same transmission line in different frequency bands are described in U.S. Pat. No. 5,848,150 and U.S. Pat. No. 4,764,922. However, none of these documents addresses the problem of impedance matching to the complex impedance of a transmission line.

BRIEF SUMMARY

In a system in which different types of telecommunications traffic are transmitted over a common transmission line in different frequency bands a splitter filter is used to separate the different types of traffic, which splitter filter includes a high-pass filter and a low-pass filter. In such a system, the telecommunications traffic that passes through the low-pass filter is often speech traffic associated with a telephone call.

Echoes and side tones can be highly disturbing in the case of telephone conversations and consequently it is desirable to avoid these phenomena to the greatest possible extent. As before mentioned, effective impedance matching between the low-pass filter and the transmission line will result in good transmission properties and in far less problems relating to echo and side tones.

One problem with the aforementioned active filters is that they must be powered. This can be problematic in many instances, particularly when it is desired to place the filter at a location where no power supply source is found. Another problem with active filters is that they will not function in the event of a power failure. Passive filters are therefore preferred.

The present invention addresses the problem of providing a filter that will afford good impedance matching to a transmission line or to a similar complex impedance and which is passive at the same time.

The object of the invention is thus to provide a passive filter that has a complex impedance and also a method for designing such a filter. In order to solve the aforesaid problem, it is necessary for the impedance of the filter to be complex such as to obtain good impedance matching to an impedance similar to the complex impedance of a transmission line. Another object of the invention is to provide a splitter filter which includes a passive filter that has a complex impedance of the aforementioned nature.

The inventive design of the passive filter with complex impedance is made possible by introducing certain losses intentionally in the filter. The losses contribute towards making the filter impedance sufficiently complex to match the complex impedance of a transmission line.

The invention utilises the observation that certain losses in a splitter filter can be accepted in many situations. The invention is also based on the observation that the statement in column 3, lines 61-65, of the aforesaid U.S. Pat. No. 5,623,543 to the effect that passive filters have a resistive impedance must be based on the premise that this filter is loss-free or almost loss-free. Traditionally resistances are not included intentionally in a passive filter, in order to keep down the losses therein. However, the invention shows that when losses of a given specific level can be accepted, a resistance that is introduced intentionally in a passive filter will contribute towards providing the filter with a complex impedance such as to enable good matching to the transmission line impedance to be obtained.

According to one embodiment of the invention, an inventive filter is designed from a cable simulator section, which simulates the impedance of a transmission line to which the filter shall be coupled. The cable simulator section is designed to also simulate the resistance of the transmission line. A passive filter that has a complex impedance similar to that of the transmission line can be created by giving the cable simulator section improved stop band attenuation in a desired frequency range.

One advantage afforded by the inventive filter is that it can be installed in a place that lacks a power supply. Another advantage is that an inventive filter will also function in the event of a power failure. Active elements must be powered electrically, may be sensitive to overvoltages, and may enter a self-oscillating mode. Because the inventive filter is passive, yet another advantage afforded by the invention is that the aforesaid problems associated with active elements can be avoided.

Still another advantage afforded by an inventive filter is that it enables good impedance matching to be achieved to a transmission line to which the filter shall be coupled. This enables problems relating to echoes and side tones to be minimised.

The invention will now be described in more detail with reference to preferred embodiments thereof and also with reference to the accompanying drawings.

DESCRIPTION OF PREFERRED EMBODIMENTS

As before mentioned, there are several reasons why it would be particularly beneficial to use, in a splitter filter, a passive low-pass filter that has a complex impedance. It is desirable that the impedance of the low-pass filter will provide good matching to the complex impedance of the transmission line, so as to avoid disturbing echoes and side tones, for instance. Thus, there is an interest in a method for designing a passive filter that has a complex impedance which matches a predetermined complex impedance in a satisfactory fashion. No such method has, however, been available hitherto. For instance, it is stated in column 3, lines 61-65, of U.S. Pat. No. 5,623,543 that the requirement of impedance matching cannot be fulfilled with passive filters since their characteristic impedances are of a resistive nature. The invention shows, however, that passive filters, which have a truly complex impedance, can be designed.

Figure 1:
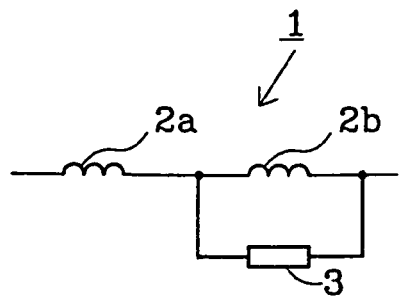
FIG. 1 illustrates a circuit diagram of a circuit that is equivalent to an impedance-multiplied inductance.

A straightforward attempt to design a passive filter having a complex impedance is to begin with a passive filter that has a resistive, or essentially resistive, impedance and which is loss-free or has only low losses. The filter used as the basis in the design attempt is hereinafter referred to as the resistive filter, since the filter at least has a generally resistive impedance. The design attempt aims at converting the impedance of the resistive filter to a predetermined complex impedance $Z_0$, here designated the matching impedance, without influencing the filtering properties of the resistive filter to any appreciable extent. The attempt to convert the impedance of the resistive filter is carried out by multiplying the impedance by the factor $Z_0/R_0$ for each element in the resistive filter, where $R_0$ is the resistance of the resistive filter. With a nominal impedance $$Z_0 = R_1 + \frac{1}{\frac{1}{R_2} + s \cdot C_2}$$

an impedance multiplication of an inductance in the resistive filter will result in the following:

$$s \cdot L \rightarrow s \cdot L \cdot \frac{R_1 + \frac{1}{\frac{1}{R_2} + s \cdot C_2}}{R_0} = s \cdot L \cdot \frac{R_1}{R_0} + \frac{1}{\frac{R_0}{R_2 \cdot s \cdot L} + \frac{C_2 \cdot R_0}{L}},$$

which is equivalent to the circuit section 1 shown in FIG. 1. The circuit section 1 includes a first coil 2a having the inductance $$L \cdot \frac{R_1}{R_0}$$

connected in series with a second coil 2b having the inductance $$L \cdot \frac{R_2}{R_o},$$

wherein a resistor 3 having the resistance $$\frac{L}{C_2 \cdot R_0}$$

is connected in parallel with the second coil 2b.

However, impedance multiplication of a capacitance in the filter by the factor $Z_0/R_0$ does not lead to a simple equivalence as in the case when an inductance is impedance multiplied. Instead, the result is an impedance that includes frequency-dependent negative resistance. It is necessary to use an active element in order to obtain such an impedance, and it is therefore impossible to design a passive filter that includes a complex impedance similar to the matching impedance by means of this method.

The invention makes possible the design of a passive filter having a complex impedance which when the filter is connected to a predetermined complex impedance will match said predetermined complex impedance. The predetermined complex impedance may be the impedance of a specific transmission line, an impedance defined in a standard, or some other impedance that is found suitable to match the filter impedance to. One example of a standard-defined impedance is the so-called ETSI impedance ($Z_{ETSI}$=150 nF//750 Ω+270 ω) which is produced as a compromise between the impedances of different cable dimensions and lengths and which is often used as a matching impedance. It is usual to place conditions on the properties of a filter in the situation when the filter is connected to a certain determined impedance. In ITU-T Draft G.992.1, Annex E are requirements set up for attenuation and attenuation distortion of POTS and ISDN-BA splitter filters in Europe when these filters are connected to an ETSI impedance.

The embodiments of the invention presented in the following are concerned primarily with passive low-pass filters in ADSL systems, since this field of application of the invention is of particular interest. However, the invention is not restricted to the pass band of the filter, but can be applied to design filters that have different types of pass bands, such as high-pass filters, band-pass filters and low-pass filters. Neither is an inventive filter restricted to any given type of system. For instance, it is envisaged that the invention will be of interest in respect of DSL systems other than ADSL, such as VDSL systems or HDSL systems.

According to the invention, the filter is intentionally given losses that contribute towards imparting the desired complex nature to the impedance of the filter. In the aforedescribed design attempt the starting point was a loss-free filter which had desired filtering properties and with which an attempt was made to change its impedance to a complex impedance corresponding to the matching impedance. The opposite starting point is taken in accordance with one embodiment of the invention. In this embodiment, there is first designed a circuit segment that has a complex impedance corresponding to the matching impedance, whereafter a filter is designed on the basis of this circuit segment by providing said circuit segment with desired filtering properties. Losses are intentionally allowed and contribute in providing the filter with the desired complex impedance. Naturally, it is normally endeavoured to avoid losses that will impair signal transmission, although it will be apparent from the description of the invention that losses can be utilised to achieve desired results in some instances. As mentioned, ITU-T Draft G.992.1, Annex E, specifies requirements concerning POTS and ISDN-BA splitter filters in Europe. It is clear from this document that an insertion loss of up to 1 dB at a frequency of 1 kHz is acceptable. This provides room for permitting intentional losses that can be utilised in the design of a passive filter that has a complex impedance. The amount of leeway available with respect to designing a filter with intentional losses will, of course, depend on the requirements placed on the properties of the filter.

Figure 2:
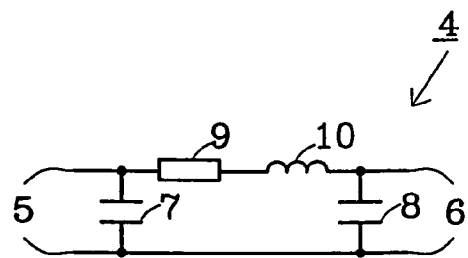
FIG. 2 is a circuit diagram illustrating a cable simulator section.
Figure 3:
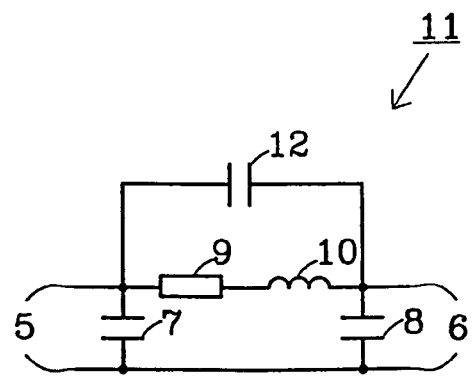
FIG. 3 is a circuit diagram illustrating a filter section according to the present invention.

Assume that a low-pass filter shall be designed and that the impedance of the low-pass filter shall emulate the characteristic impedance of a transmission cable to the best possible extent. The impedance of the transmission cable can be represented by four parameters, these being the resistance, the inductance, the capacitance and the conductance per unit of length. The conductance can mostly be ignored. The characteristic impedance of the transmission cable is $$Z_{cable} = \sqrt{\frac{r + j\omega l}{g + j\omega c}},$$

where r is the resistance, l is the inductance, g is the conductance, c is the capacitance, ω is the angular frequency and $j^2$=−1. The impedance of a given length of transmission cable can be simulated with a circuit section that includes discrete components. Several such circuit sections can be cascade-connected to simulate the impedance of another length of the transmission cable. FIG. 2 shows an unbalanced cable simulator section 4. The cable simulator section 4 includes a first port 5 and a second port 6. A first capacitance 7 is connected across the first port 5, while a second capacitance 8 is connected across the second port 6. A resistance 9 and an inductance 10 are connected in series between the capacitances 7, 8. The cable simulator section 4 has very small stop band attenuation and will therefore function poorly as a filter. The cable simulator section 4 can, however, be converted to a filter section 11, by connecting a third capacitance 12 in parallel with the resistance 9 and the inductance 10, as illustrated in FIG. 3.

Alternatively, it would have been possible to connect the third capacitance 12 in parallel solely with the inductance 10. The third capacitance 12 introduces an attenuation peak which improves the stop band attenuation of the filter section 11. The influence of the third capacitance in the speech band is negligible in the case of a low-pass filter which is intended for use in an ADSL system, owing to the large frequency difference between the speech band and the stop band. The filter section 11 is a very simple passive filter having complex impedance in accordance with the invention. Because the filter section 11 includes the resistance 9, it has intentional losses, which contribute towards good impedance matching to the complex impedance of the transmission cable.

In many instances the simple filter section 11 will not suffice to fulfill requirements placed on filter properties and impedance. Improved filter properties capable of fulfilling set requirements can be achieved, by cascade-coupling a plurality of filter sections 11.

An inventive filter, which fulfils the requirements laid down in ITU-T Draft G.992.1, Annex E, with respect to POTS and ISDN-BA splitter filters in Europe is described below. As before mentioned, splitter filters include a high-pass filter and a low-pass filter. Impedance matching is particularly important in the case of the low-pass filter, and it is stated in ITU-T Draft G.992.1 that matching shall take place to, e.g., the ETSI impedance $Z_{ETSI}$=150nF//750 Ω+270 Ω. Other important requirements set out in the aforesaid ITU-T document include that return loss shall be greater than 18 dB in the frequency range of 500-2000 Hz. The return loss requirement decreases at frequencies below 500 Hz and above 2000 Hz. The return loss is required to be greater than 14 dB at frequencies of 300 Hz and 3400 Hz. The insertion loss may be 1 dB at 1 kHz, and the insertion loss distortion may be at most ±1 dB in the frequency range of 200-4000 Hz.

Figure 4:
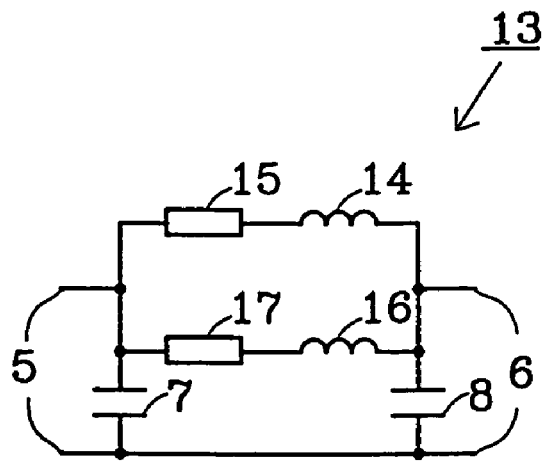
FIG. 4 is a circuit diagram illustrating a cable simulator section for a so-called ETSI impedance.
Figure 5:
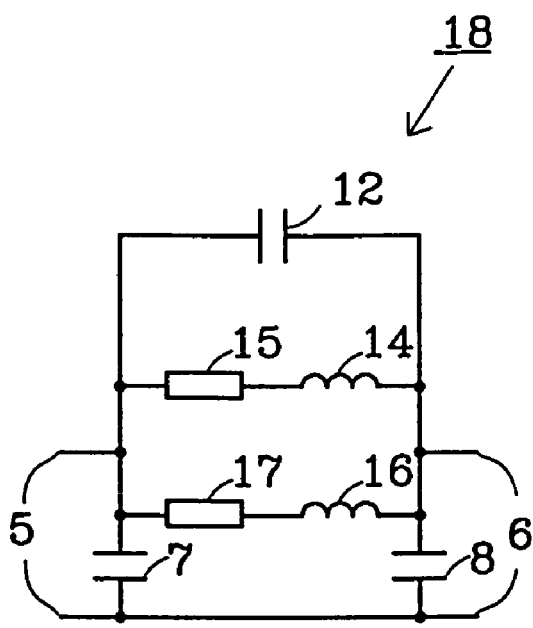
FIG. 5 is a circuit diagram illustrating an inventive filter section suitable for matching to the ETSI impedance.

With the intention of designing an inventive filter that fulfils the requirements for Europe set out in ITU-T Draft G.992.1, Annex E, there was first designed a cable simulator section that had an impedance similar to the ETSI impedance, whereafter said section was used as the basis for the continued design of the filter. Studies show that the ETSI impedance can be approximated, by cascade-coupling cable simulator sections that include series elements which have a large resistance and a small inductance for frequencies in an upper part of the speech band, and that have a small resistance and a large inductance in the lower part of the speech band. This can be achieved, for instance, with a cable simulator section 13 shown in FIG. 4, said cable simulator section 13 including a parallel-combination of a large inductance 14 in series with a small resistance 15 and a small inductance 16 in series with a large resistance 17. The cable simulator section also includes a first and a second port 5, 6 and a first and a second capacitance 7, 8 corresponding to the same elements in the cable simulator section 4 as shown in FIG. 2. As earlier mentioned, the cable simulator section 4 in FIG. 2 has poor filtering properties, and the cable simulator section 13 in FIG. 4 also has a low filtering effect. FIG. 5 illustrates a filter section 18 that is based on the cable simulator section 13 shown in FIG. 4. The capacitance 12 has been connected in parallel with the series elements 14, 15, 16, 17 in the cable simulator section 13 so as to provide greater stop band attenuation in a manner corresponding to that described with reference to FIG. 3. The inventive filter which fulfils the requirements for Europe set forth in ITU-T Draft G.992.1, Annex E, can be designed by cascade-coupling several filter sections similar to the filter section 18 in FIG. 5. However, in order to obtain the best possible filter, it may be necessary to take into account further questions concerning the design of the filter.

Figure 6:
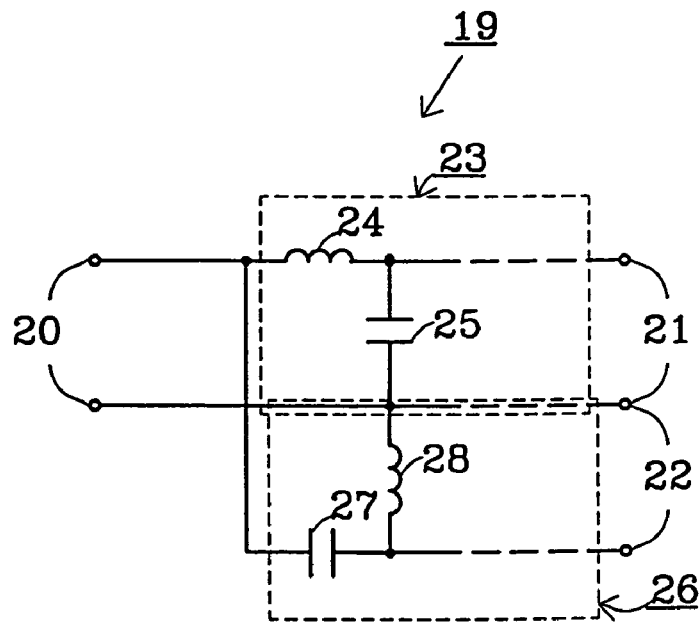
FIG. 6 is a circuit diagram illustrating part of a splitter filter which illustrates connection in parallel between a low-pass filter and a high-pass filter.

According to earlier known technology, the low-pass filter and high-pass filter are normally connected in parallel in a splitter filter. This traditional parallel coupling is illustrated in FIG. 6. FIG. 6 shows a section 19 of an unbalanced ADSL splitter filter. The section 19 can be connected to a transmission line, via a port 20. A port 21 is used for connection to the POTS route in an ADSL system, and a port 22 is used for connection to the ADSL route. A low-pass filter 23 is connected between the line port 20 and the POTS port 21. Shown in the Figure are a coil 24 and a capacitor 25, which are components in the low-pass filter 23. The lines shown in broken lines indicate that the low-pass filter 23 may include more components than the two aforementioned. A high-pass filter 26 is connected in parallel with the low-pass filter 23, between the line port 20 and the ADSL port 22. Also shown in the Figure are a capacitor 27 and a coil 28, which are components in the high-pass filter 26. The high-pass filter may include more components than the capacitor 27 and the coil 28, as indicated in broken lines in FIG. 6. In order to avoid any influence from the high-pass filter in the speech band, the high-pass filter will preferably have a high impedance for frequencies in the pass band of the low-pass filter, in parallel coupling with said filter. Correspondingly, the low-pass filter will preferably have a high impedance for frequencies in the pass band of the high-pass filter, so as not to have any deleterious influence on the ADSL traffic when the low-pass filter is connected in parallel with the high-pass filter. Thus, in ideal conditions, the properties of the filters will be independent of each other when they are parallel-coupled, although in the case of an ADSL splitter filter the capacitance of the high-pass filter will greatly influence the impedance in the speech band in practice. Consequently, it is necessary to take the input impedance of the high-pass filter into account when designing the low-pass filter.

Figure 7:
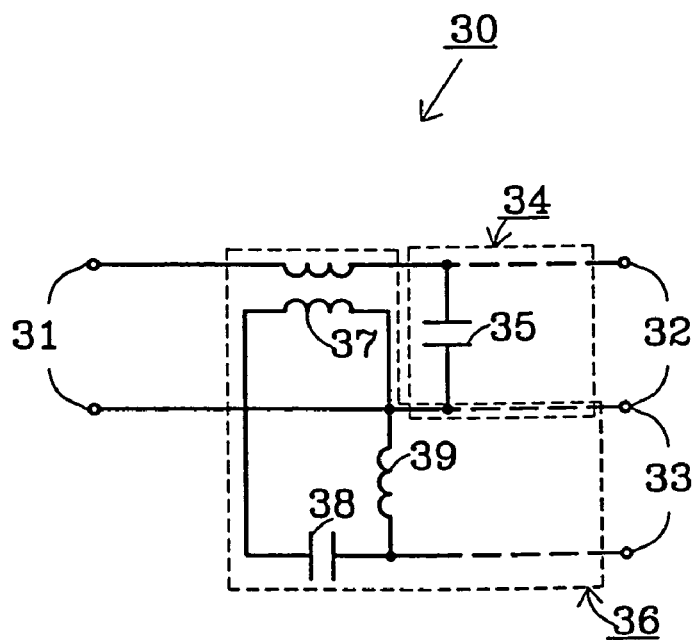
FIG. 7 is a circuit diagram of part of a splitter filter illustrating connection in series between a low-pass filter and a high-pass filter.

In telecommunications systems worldwide, it has been elected to give the POTS route a higher impedance than the characteristic impedance of a transmission cable, so as to obtain the lowest possible attenuation. However, the ADSL route in an ADSL system has an impedance which lies close to the characteristic impedance of a transmission cable. The resultant size ratio between the impedances of the POTS and ADSL routes often make a series coupling of the low-pass filter and the high-pass filter in a splitter filter preferable. When the low-pass filter and the high-pass filter are connected in series, the affect of the high-pass filter on the performance of the low-pass filter in the speech band can be made very slight. Thus, the low-pass filter can be designed almost independently of the high-pass filter in the case of a series coupling. It is true that the low-pass filter will have a strong influence on the performance of the high-pass filter in a series coupling, which must be taken into account when designing the high-pass filter, although in respect of the design of a splitter filter comprising a passive low-pass filter having complex impedance, it has been found easier to take into account the influence of the low-pass filter on the high-pass filter than vice versa. Thus, in the design of an inventive filter that fulfils the requirements for Europe set forth in ITU-T Draft G.992.1, Annex E, a series coupling is used between the high-pass filter and the low-pass filter. A series coupling of a high-pass filter and a low-pass filter is shown in FIG. 7. The Figure illustrates a section 30 of an unbalanced ADSL splitter filter. The section 30 can be connected to a transmission line, via a port 31. A port 32 is used for connection to the POTS route in an ADSL system, and a port 33 is used for connection to the ADSL route. A low-pass filter 34 is connected between the line port 31 and the POTS port 32. The Figure shows the low-pass filter 34 to include a capacitor 35. The broken lines to the right of the capacitor indicate that the low-pass filter may include more components than just the capacitor 35. A high-pass filter 36 is connected in series with the low-pass filter, between the line port 31 and the ADSL port 33. Shown in the Figure are a transformer 37, a capacitor 38 and a coil 39, these being high-pass filter components. Another embodiment of the high-pass filter may possibly lack one or both of the components 38 and 39 of the illustrated high-pass filter 36. The high-pass filter 36 may also include more components than those shown, which is indicated with broken lines in FIG. 7. The interaction between the high-pass filter and the low-pass filter in a series coupling is small when each filter has a small impedance in the pass band of the other filter. The termination of the filters against the transmission line is therefore of a different appearance in a series coupling than in a parallel coupling.

Figure 8:
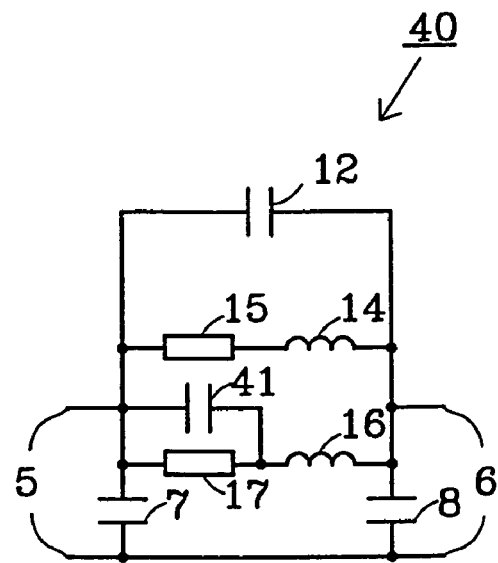
FIG. 8 is a circuit diagram illustrating one embodiment of an inventive low-pass filter with an additional pass band.

In some instances, it is desired to send through the low-pass filter metering signals at a frequency above the speech band, e.g. at a frequency of 12 or 16 kHz. However, the resistance in the filter, which has intentionally been made high in order to produce the complex impedance, results in excessive attenuation of the metering signal frequencies. This problem can be overcome by giving the low-pass filter an additional pass band. The complex impedance, and therewith the high resistance, are only necessary in the speech band, meaning that the large resistance can be decoupled for high frequencies. FIG. 8 shows a filter section 40 adapted for metering signals. The filter section 40 is identical to the filter section 18 in FIG. 5, with the exception that the filter section 40 has a capacitor 41 connected in parallel with the large resistance 17. The capacitor assists in decoupling the large resistance 17 at high frequencies.

Figure 9:
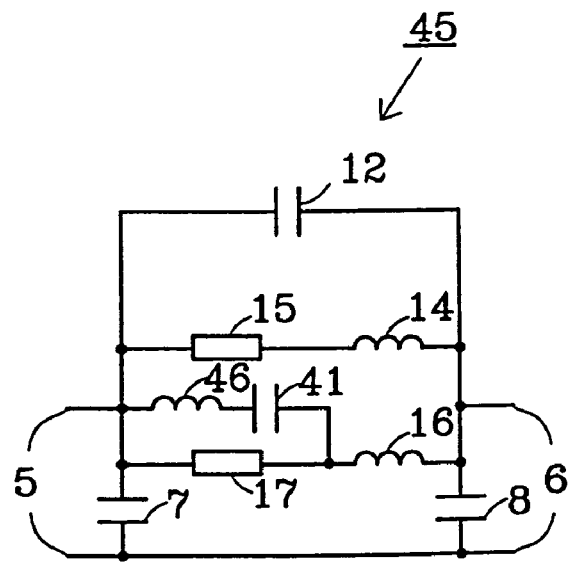
FIG. 9 is a circuit diagram illustrating an alternative embodiment of an inventive low-pass filter with an additional pass band.

Another positive effect afforded by the capacitor 17 is that it also assists in improving likeness between the impedance of the filter section and the ETSI impedance. Further improvement with respect to decoupling the large resistance 17 is achieved with a filter section 45 illustrated in FIG. 9. The filter section 45 differs from the filter section 40 in FIG. 8 by virtue of a series inductance 46 which, together with a capacitor 41, forms a series resonance circuit that can short-circuit the large resistance 17 completely at one frequency when so desired. When the frequency at which the large resistance shall be short-circuited has been determined, the element values of the series inductance 46 and the capacitor 41 can be chosen so as to obtain the desired short-circuit. Depending on requirements, it may be necessary to make the filter sections 40, 45 more complicated so that the resistance will again become high above the frequency for which a lower resistance and an additional pass band are desired. One possible way of achieving this in respect of the filter section 45 is to couple an additional capacitor in parallel with the inductance 46.

There has been presented in the aforegoing a filter section 18 which can be used to design a splitter filter that has a passive low-pass filter with a complex impedance, said splitter filter fulfilling the requirements for Europe set forth in ITU-T Draft G.992.1, Annex E. Reasons have been given in the aforegoing as to why the high-pass filter and the low-pass filter in said splitter filter should be connected in series. Improvements in the filter section 18 leading to an extra pass band for metering signals have also been discussed. An inventive splitter filter that fulfils the requirements for Europe laid down in ITU-T Draft G.992.1, Annex E, can be designed on the basis of these teachings. In order to provide a splitter filter that has the best possible properties, it is necessary to compromise between stop band attenuation, pass band attenuation, return loss and attenuation distortion, among other things. This can be achieved by allowing an optimising procedure to determine the component values of the splitter filter subject to the requirements concerned being fulfilled. Examples of suitable optimisation routes are found described in the manual Andrew Grace, "Optimization Toolbox for Use with MATLAB", Oct. 1994, The Math Work, Inc., and also in the circuit analysis program SABER.

Figure 10:
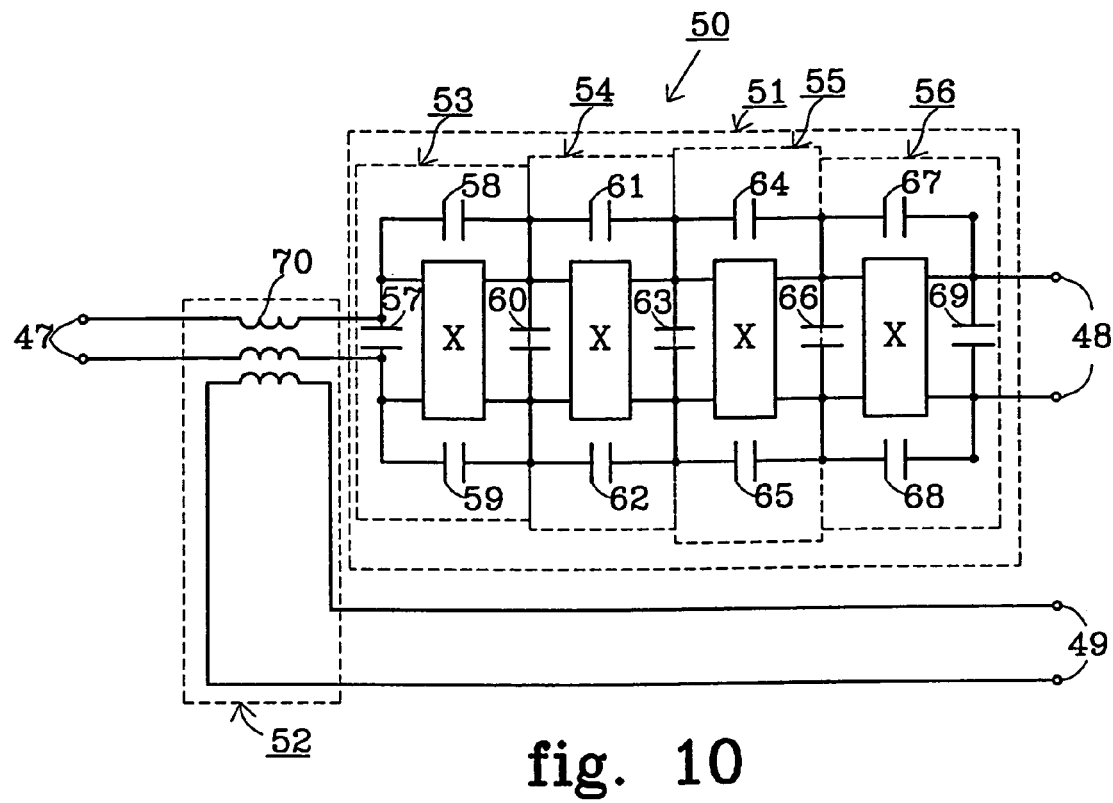
FIG. 10 is a circuit diagram illustrating a splitter filter, which includes an inventive low-pass filter.

FIG. 10 illustrates a splitter filter 50 that fulfils the requirements for Europe laid down in ITU-T Draft G.992.1, Annex E. The splitter filter includes a passive low-pass filter 51 which has a complex impedance and which is connected in series with a passive high-pass filter 52. The splitter filter 50 is thus fully passive. The low-pass filter 51 is comprised of four cascade-coupled balanced filter sections 53, 54, 55, 56 each of which is similar to a balanced form of the filter section 40 in FIG. 8. Thus, each filter section 53, 54, 55, 56 is passive with intentional losses and complex impedance. A common feature of each filter section is that they all include a circuit X, which is described in detail hereinafter with reference to FIG. 11. In addition to the circuit X, the filter section 53 includes a capacitor 57 having a capacitance $C_1=10$ nF, two capacitors 58, 59 having a capacitance $C_2=2,7$ nF and a capacitor 60 having a capacitance $C_3=22$ nF, said capacitor being shared with the filter section 54. In addition to the aforesaid components, the filter section 54 includes two capacitors 61, 62 having a capacitance $C_4=15$ nF, and a capacitor 63 having a capacitance $C_5=15$ nF, which is shared with the filter section 55. In addition to the aforesaid components, the filter section 55 includes two capacitors 64, 65 having a capacitance $C_6=15$ nF, and a capacitor 66 having a capacitance $C_7=12$ nF, which is shared with the filter section 56. In addition to the aforesaid components, the filter section 56 includes two capacitors 67, 68 having a capacitance $C_8=10$ nF, and a capacitor 69 having a capacitance $C_9=22$ nF. The high-pass filter includes an inductor 70 that has three windings. The main inductance of the inductor is $L_{hp}=500$ μH. As mentioned in the aforegoing, it is necessary to take into account the influence of the low-pass filter when designing the high-pass filter when the high-pass filter and the low-pass filter are connected in series. Thus, the properties of the high-pass filter are not determined solely by the inductor 70, but also by the influence from the low-pass filter 51.

Figure 11:
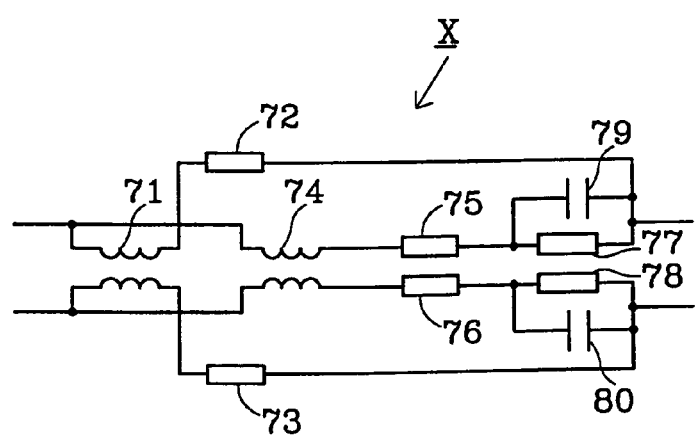
FIG. 11 is a detailed circuit diagram illustrating a circuit in the splitter filter shown in FIG. 10.

The circuit X shown in FIG. 11 includes an inductor 71 which has two windings with a total inductance of $L_1=11,5$ mH, two resistors 72, 73 with a resistance of $R_1=4,83$ Ω, an inductor 74 having two windings with a total inductance of $L_2=5,87$ mH, two resistors 75, 76 having a resistance $R_2=6,5$ Ω, two resistors 77, 78 having a resistance of $R_{22}=54,5$ Ω, and two capacitors 79, 80 having the capacitance $C_{22}=680$ nF. Alternatively, the resistors 72, 73, 75 and 76 may be replaced completely or partially with winding resistances in the inductors 71 and 74.

The splitter filter 50 was designed by first designing a passive filter section with a complex impedance similar to the ETSI impedance, as described above. This filter section was then allowed to function as a base for the low-pass filter 51 in the splitter filter. The element values were then optimised subject to requirements on the properties of the filter. In this case, the requirements concerned were the requirements for Europe laid down in ITU-T Draft G.992.1, Annex E. These requirements cannot be satisfied with solely one filter section in the low-pass filter. However, the requirements can be achieved with a cascade-coupling of four sections, the result being the splitter filter 51 having the element values described with reference to FIGS. 10 and 11. It is probable that still better results could be achieved by cascade-coupling more than four sections. In the case of the splitter filter 51, filter sections that are structure-wise identical have been connected in cascade, although it is also possible in accordance with the invention to design a passive low-pass filter which includes a complex impedance and which is comprised of a plurality of filter sections that are structure-wise different.

In the present context, by structure-wise identical sections is meant sections whose circuit diagrams have an identical appearance but whose respective components have mutually different element values. By structure-wise different sections is thus meant sections whose circuit diagrams have different appearances.

According to the invention, it is not necessary for all cascade-coupled filter sections to include intentional losses. The invention requires solely that intentional losses in the low-pass filter as a whole will contribute towards giving the filter its characteristic complex impedance. Thus, the present invention enables a filter section that includes intentional losses to be combined with a filter section in which no intentional losses are included in the design of an inventive filter design.

Although a couple of embodiments of inventive filter sections have been described, it will be understood that a very large number of alternative filter section embodiments are possible within the scope of the invention. Yet another couple of alternative embodiments of alternative filter sections will now be described with reference to the drawings. A common feature of all the inventive filter sections is that they are passive and include a truly complex impedance, and that each of the filter sections includes at least one resistance, which contributes towards obtaining the truly complex impedance of the filter section .

Figure 12:
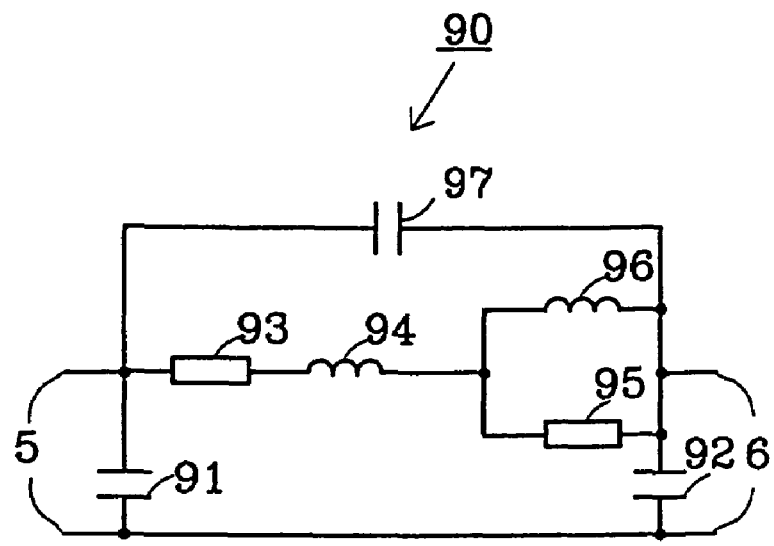
FIG. 12 is a circuit diagram illustrating an alternative embodiment of an inventive filter section.

FIG. 12 illustrates an alternative embodiment of an inventive filter section 90. The filter section 90 is an alternative to the filter section 18 described above with reference to FIG. 5 and, as with the filter section 18, is adapted to form a suitable building block in a filter that is to be matched to the aforesaid ETSI impedance. The filter section 90 includes a first and a second port 5, 6, a capacitor 91, and a capacitor 92. The filter section 90 also includes a relatively small resistance 93 in series with a relatively small inductance 94, and a relatively large resistance 95 in parallel with a relatively large inductance 96. A capacitor 97 gives to the filter section attenuation peaks, which improve the filtering effect of the filter section.

Figure 13:
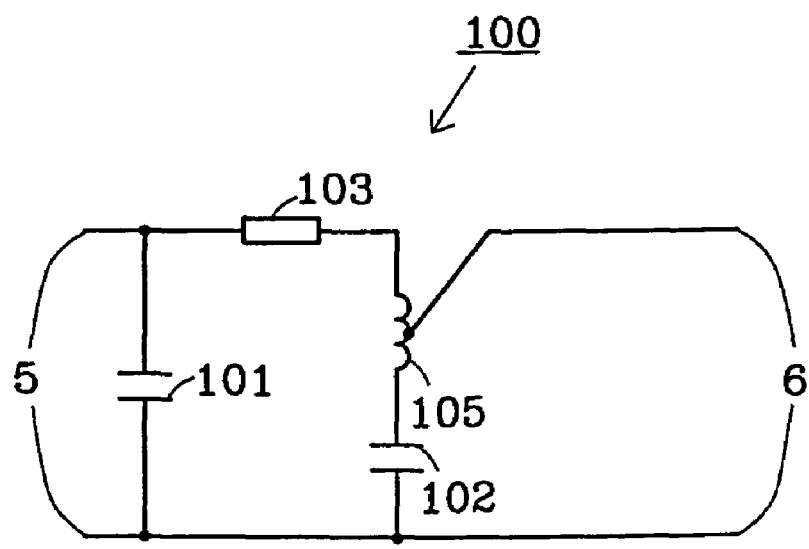
FIG. 13 is a circuit diagram illustrating another alternative embodiment of an inventive filter section.

FIG. 13 illustrates still a further alternative embodiment of an inventive filter section 100. The filter section 100 enables properties similar to the filter section 11 in FIG. 3 to be obtained. The filter section 100 includes a first and a second port 5, 6, two capacitors 101, 102, a resistance 103, and a coupled coil 105. The coupled coil gives an attenuation peak to the filter section 100 in the same way as the capacitor 12 in FIG. 3.

All of the embodiments shown in FIGS. 2-9, 12 and 13 are unbalanced. In practice, however, balanced equivalents are the most common. It will be understood that the invention is not restricted to a balanced or an unbalanced form. It will also be understood that all presented embodiments have a balanced or an unbalanced equivalent that is included by the invention.

Figure 14:
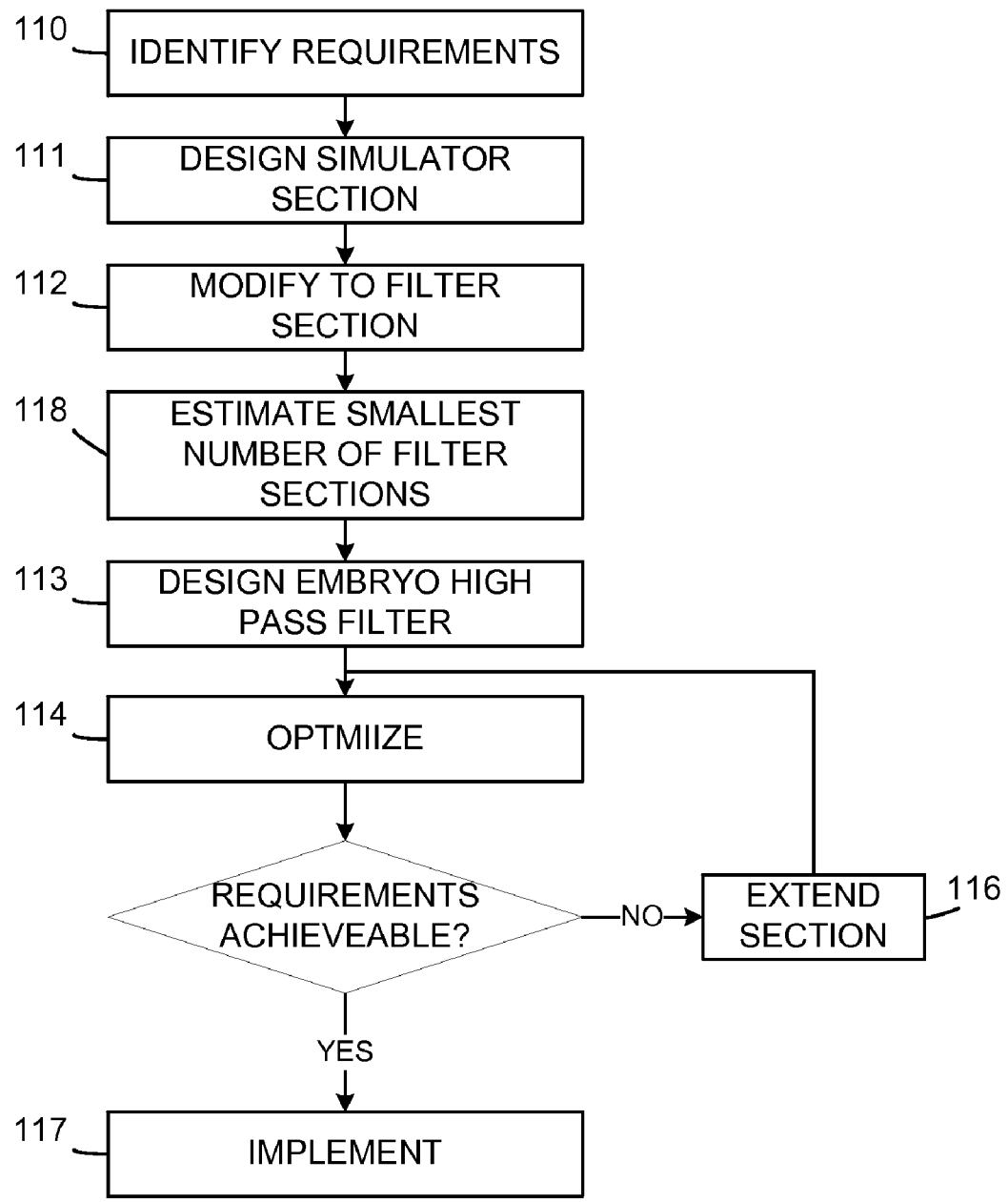
FIG. 14 is a flowchart illustrating an inventive method.

The description of the various embodiments of inventive devices made with reference to the drawings has also described indirectly an inventive method of designing passive filters with complex impedances. With the intention of describing an inventive method in still more detail, reference is made to the flowchart of FIG. 14, which illustrates one embodiment of such a method. The method described in FIG. 14 is an inventive method of designing a splitter filter which includes a passive low-pass filter that has a truly complex impedance. The attenuation requirements (e.g. stop band attenuation and return loss) and attenuation distortion requirements to be fulfilled by the splitter filter are identified in a first step 110. The complex impedance to which the filter shall be matched is also determined in conjunction herewith. A cable simulator section having an impedance close to the matching impedance is designed on the basis of the matching impedance in a following step 111. This cable simulator section is modified to a filter section in step 112, by improving the stop band attenuation, e.g., with the aid of a parallel capacitor that introduces attenuation peaks in the stop band. The filter section functions as a first beginning or the embryo of a low-pass filter in the splitter filter.

Depending on the requirements that are to be fulfilled and also on the extent of the knowledge and experience concerning filter design at hand, it may be beneficial to make an estimation of the smallest number of cascade-coupled filter sections that are required to fulfil the set requirements, step 118. When it is known that the requirement cannot possibly be fulfilled with fewer than a given number of filter sections, the embryonic low-pass filter is designed with the estimated smallest number of filter sections. If available knowledge is insufficient to enable an estimation to be made in step 118, a sole filter section is used in the embryonic low-pass filter.

In this case, when a splitter filter is to be designed it is necessary to design an embryo of a high-pass filter which is suitably connected in series to the low-pass filter, step 113. Because this example is chiefly concerned with the design of a low-pass filter, the design of the high-pass filter part of the splitter filter will not be described in more detail.

The element values for the first embryo of the splitter filter are optimised in a following step 114, on the basis of the set requirements. Subsequent to determining the element values, it is ascertained whether or not the set requirements can be possibly achieved with a splitter filter having the structure in question, step 115. If the requirements cannot be fulfilled, the low-pass filter is extended by cascade-coupling a further filter section to the original or embryonic filter section, step 116. As before mentioned, this further filter section may be identical structure-wise with the first filter section, or may be structure-wise different to said first filter section. Optimisation of the element values is then repeated, step 114. If the set requirements can now be fulfilled, the design of the splitter filter is ready on paper and the filter can now be implemented on the basis of the design created.

Since the example is concerned chiefly with the design of a low-pass filter, it is the low-pass filter and the requirements set thereon that are the focus in steps 114, 115 and 116. Separate measures may be needed to adapt the high-pass filter part of the splitter filter, although these measures are not described in this document.

The central point of an inventive method of designing a passive filter that has a truly complex impedance is, of course, that only passive components are used and that resistances are introduced to give the filter the truly complex impedance that is desired in respect of matching. In the method described in FIG. 14, the resistance which assists in giving the filter its complex impedance is introduced in step 111, inasmuch that the cable simulator section includes the resistance of a cable that has said matching impedance.

Different embodiments of an inventive method can vary widely. The inventive method in FIG. 14 relates to the design of a splitter filter in which a passive low-pass filter having a complex impedance is a constituent part. The design of a complete splitter filter may not be the aim in some cases. For instance, the main aim may be to devise a method for designing passive filter sections having complex impedances that can be used later as building blocks in the design of a complete splitter filter.

Knowledge that certain permitted losses can give some leeway in designing filters with intentional losses and thereby obtain a truly complex impedance in respect of a passive filter, will enable a departure to be made from the order in which the method steps have been described with reference to FIG. 14. With this knowledge, it may be possible to adapt existing passive filters having essentially a resistive impedance so that they will obtain a more complex impedance. This can be achieved by including an additional resistance in the filter, for instance by connecting-up a resistor or by using coils with intentional high resistances. In this case, an inventive filter is produced without going through the method steps of first producing a circuit that has the desired complex impedance and thereafter adapting the filter properties of the circuit. Thus, it is not necessary in accordance with the invention to implement all the steps in FIG. 14 in performing an inventive method, and neither need the steps be carried out in any specific order.

The invention claimed is:

1. A filter for filtering signals in a telecommunications system comprising a transmission line and for impedance matching to a complex impedance, wherein the filter comprises:
   plural filter components;
   at least one first pass band;
   wherein the filter is passive;
   wherein a characteristic impedance of the filter is complex so that it matches the complex impedance; and
   wherein a resistance of at least one of the filter components is in series with at least one inductance of the filter components, said resistance being chosen such that said resistance in series with said at least one inductance assists in giving the filter said complex characteristic impedance.

2. A filter according to claim 1, wherein the filter includes at least one parallel combination of a first inductance in series with a first resistance and a second inductance in series with a second resistance, wherein said first inductance is large in relation to the second inductance, and wherein the first resistance is small in relation to the second resistance.

3. A filter according to claim 2, wherein the filter includes at least two circuit of which at least one circuit segment includes said parallel combination.

4. A filter according to claim 3, wherein the circuit segments are four structure-wise identical circuit segments.

5. A filter according to claim 1, wherein the filter includes at least one series combination of a first inductance in series with a first resistance and a second inductance in parallel with a second resistance, wherein the first inductance is small in relation to the second inductance, and wherein the first resistance is small in relation to the second resistance.

6. A filter according to claim 1, wherein the filter includes at least two cascade-coupled circuit segments of which at least one circuit segment includes at least said resistance that assists in giving the characteristic impedance of said filter said complex character.

7. A filter according to claim 1, wherein the resistance that assists in giving the characteristic impedance of the filter said complex character is comprised of at least one resistor.

8. A filter according to claim 1, wherein the resistance that assists in giving the characteristic impedance of the filter said complex character is comprised of at least one winding resistance of an inductor.

9. A filter according to claim 1, wherein the predetermined complex impedance is the characteristic impedance of a transmission line.

10. A filter according to claim 1, wherein the complex impedance is a European Telecommunications Standards Institute (ETSI) impedance $Z_{ETSI}$=150 nF//750 $\Omega$+270 $\Omega$.

11. A filter according to claim 1, wherein the filter includes at least one cable simulator section, which cable simulator section has a characteristic impedance that matches the complex impedance; wherein the filter also includes at least one capacitor, wherein said capacitor assists in giving the filter at least one attenuation peak in a predetermined frequency range in coaction with said cable simulator section.

12. A filter according to claim 1, wherein the filter includes at least one cable simulator section, which cable simulator section has a characteristic impedance that matches the complex impedance; and in that the filter includes at least one coupled coil, which coupled coil includes an inductance in the cable simulator section and assists in giving the filter at least one attenuation peak in a predetermined frequency range.

13. A filter according to claim 1, wherein the filter is a low-pass filter.

14. A filter according to claim 1, wherein the filter includes a further pass band in a predetermined frequency range, said further pass band differing from said at least first pass band.

15. A splitter filter which includes at least one filter according to claim 1.

16. A splitter filter according to claim 15, wherein said filter according to claim 1 is a low-pass filter; and wherein the low-pass filter is connected in series to a high-pass filter.

17. A filter according to claim 1, wherein the filter is configured to match the complex impedance, and wherein the complex impedance is at least one of: (1) impedance of the transmission line; and (2) a standard-defined impedance.

18. A method for designing a filter intended for filtering signals in a telecommunications system and for impedance matching to a complex impedance of a transmission line, the method comprising:
   providing the filter with at least one first pass band;
   using only passive components in the filter;
   introducing into the filter at least one resistance, said resistance being in series with at least one inductance;
   choosing the resistance such that such that said resistance in series with said inductance assists in giving the filter a complex characteristic impedance that matches the complex impedance.

19. A method according to claim 18, wherein the resistance that assists in giving the filter its said complex characteristic impedance is implemented with the aid of at least one resistor.

20. A method according to claim 18, wherein the resistance which assists in giving the filter its said complex characteristic impedance is implemented with the aid of at least one winding resistance of an inductance.

21. A method according to claim 18, wherein the filter is provided with at least one parallel combination of a first inductance in series with a first resistance and a second inductance in series with a second resistance, said first inductance being large in relation to the second inductance and said first resistance being small in relation to the second resistance.

22. A method according to claim 18, wherein the filter is comprised of at least two circuit segments, of which at least one circuit segment includes said parallel combination.

23. A method according to claim 22, wherein the circuit segments are four circuit segments that are structure-wise identical.

24. A method according to claim 18, wherein the filter is provided with at least one series combination of a first inductance in series with a first resistance, and a second inductance in parallel with a second resistance, wherein the first inductance is small in relation to the second inductance, and wherein the first resistance is small in relation to the second resistance.

25. A method according to claim 18, wherein the filter is a low-pass filter.

26. A method according to claim 18, wherein the complex impedance is a European Telecommunications Standards Institute (ETSI) impedance $Z_{ETSI}$=150 nF//750 $\Omega$+270 $\Omega$.

27. A method according to claim 18, wherein the method also includes optimizing the element values of the filter components on the basis of requirements placed on the properties of said filter.

28. A method according to claim 27, wherein the method also includes an iteration procedure, in which the optimizing of said element values is repeated until the set requirements are fulfilled, and in which a circuit segment is added to and cascade-coupled with the earlier filter design with each iteration.

29. A method according to claim 28, wherein the method includes establishing a least number of circuit segments with which the set requirements can be fulfilled; and in that a filter having said least number of circuit segments is used in the optimizing step at the beginning of the iteration procedure.

30. A method according to claim 18, wherein the filter is provided with a further pass band in a predetermined frequency range, said further pass band differing from said at least one first pass band.

31. A method of designing a splitter filter that includes a high-pass filter and a low-pass filter, wherein at least one of the filters is designed in accordance with a method according claim 18.

32. A method according to claim 31, wherein at least one of the filters designed in accordance with claim 18 is a low-pass filter; and wherein the low-pass filter is connected to the high-pass filter in series.

33. A method according to claim 18, further comprising configuring the filter to match the complex impedance, and wherein the complex impedance is at least one of:
(1) impedance of the transmission line; and (2) a standard-defined impedance.

* * * * *